(12) United States Patent
Louis

(10) Patent No.: US 7,064,606 B2
(45) Date of Patent: *Jun. 20, 2006

(54) HIGH EFFICIENCY AMPLIFIER AND METHOD OF DESIGNING SAME

(75) Inventor: Edward Vincent Louis, Saint Charles, IL (US)

(73) Assignee: Andrew Corporation, Orland Park, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/795,055

(22) Filed: Mar. 5, 2004

(65) Prior Publication Data

US 2004/0189381 A1 Sep. 30, 2004

Related U.S. Application Data

(63) Continuation-in-part of application No. 10/402,800, filed on Mar. 28, 2003.

(51) Int. Cl.
H03F 3/68 (2006.01)

(52) U.S. Cl. .................. 330/124 R; 330/285; 330/295; 330/51; 330/53

(58) Field of Classification Search ............ 330/124 R, 330/285, 295, 51, 53
See application file for complete search history.

(56) References Cited

U.S. PATENT DOCUMENTS

| | | | |
|---|---|---|---|
| 4,439,744 A | 3/1984 | Kumar et al. | |
| 4,631,492 A | 12/1986 | Magarshack et al. | |
| 4,677,393 A | 6/1987 | Sharma | |
| 4,717,884 A | 1/1988 | Mitzlaff | |
| 5,083,094 A | 1/1992 | Forsberg | |
| 5,136,256 A | 8/1992 | Salzberg | |
| 5,389,890 A | 2/1995 | Burrage | |
| 5,430,411 A | 7/1995 | Boulic | |
| 5,543,751 A * | 8/1996 | Stedman et al. | 330/124 D |
| 5,663,682 A | 9/1997 | Meline et al. | |
| 5,896,065 A | 4/1999 | Myer | |
| 5,999,046 A | 12/1999 | Kotzamanis | |
| 6,094,097 A | 7/2000 | Ke | |
| 6,262,629 B1 | 7/2001 | Stengel et al. | |
| 6,384,680 B1 | 5/2002 | Takei et al. | |
| 6,396,349 B1 | 5/2002 | Takei et al. | |
| 6,639,463 B1 * | 10/2003 | Ghanadan et al. | 330/124 R |

FOREIGN PATENT DOCUMENTS

| | | |
|---|---|---|
| FR | 2 525 834 | 10/1983 |
| JP | 2002043857 | 2/2002 |
| WO | WO 03/065599 | 8/2003 |

OTHER PUBLICATIONS

Hayt, Jr. "Engineering Electromagnetics" McGraw Hill Book Company 1981 p. 449.*

(Continued)

Primary Examiner—Michael B. Shingleton
(74) Attorney, Agent, or Firm—Wood, Herron & Evans, LLP

(57) ABSTRACT

An amplifier includes a main amplifier circuit and at least one auxiliary amplifier circuit. Portions of an RF signal to be amplified are delivered to the main and auxiliary amplifiers. The auxiliary amplifier circuit is selectively operable to operate in combination with the main amplifier circuit, such as based on the level of the RF signal. At least one hybrid coupler circuit has input ports coupled with outputs of the main amplifier circuit and auxiliary amplifier circuit. The hybrid coupler circuit is operable to combine amplifier circuit output signals at a coupler first output port. A coupler second output port is terminated with one of an electrical short and an electrical open circuit.

38 Claims, 9 Drawing Sheets

OTHER PUBLICATIONS

Karmel et al. "Introduction to Electromagnetic and Microwave Engineering" John Wiley & Sons, Inc. 1998 pp344-345.*

IBM Technical Disclosure Bulletin, *Transistor Audio Amplifier*, Apr., 1960.

International Search Report, received Sep. 20, 2004.

* cited by examiner

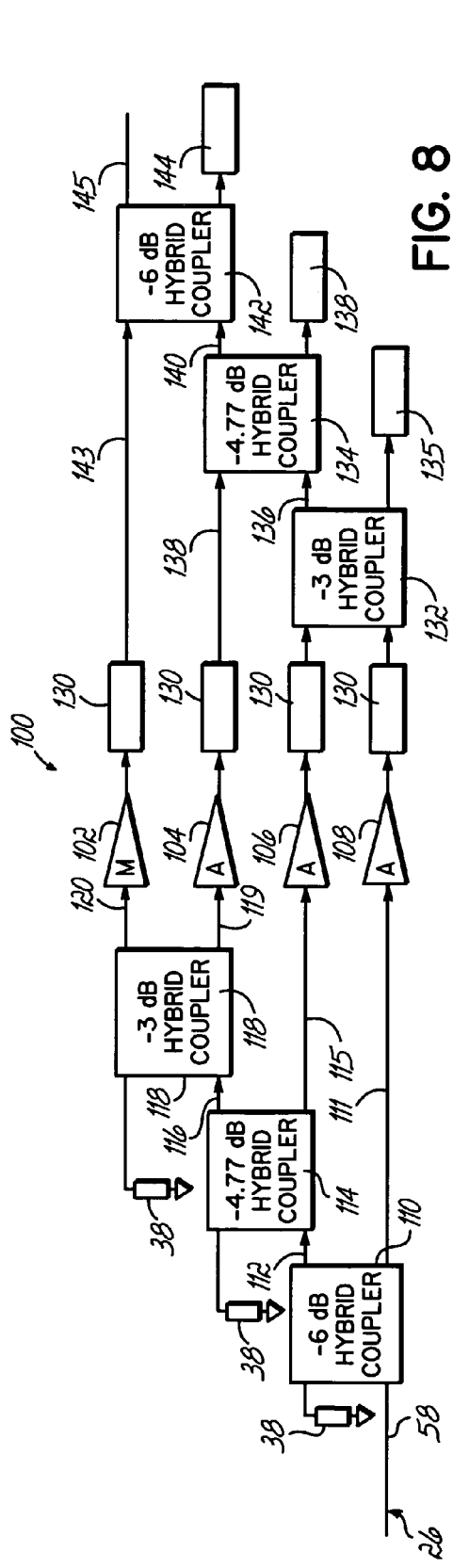
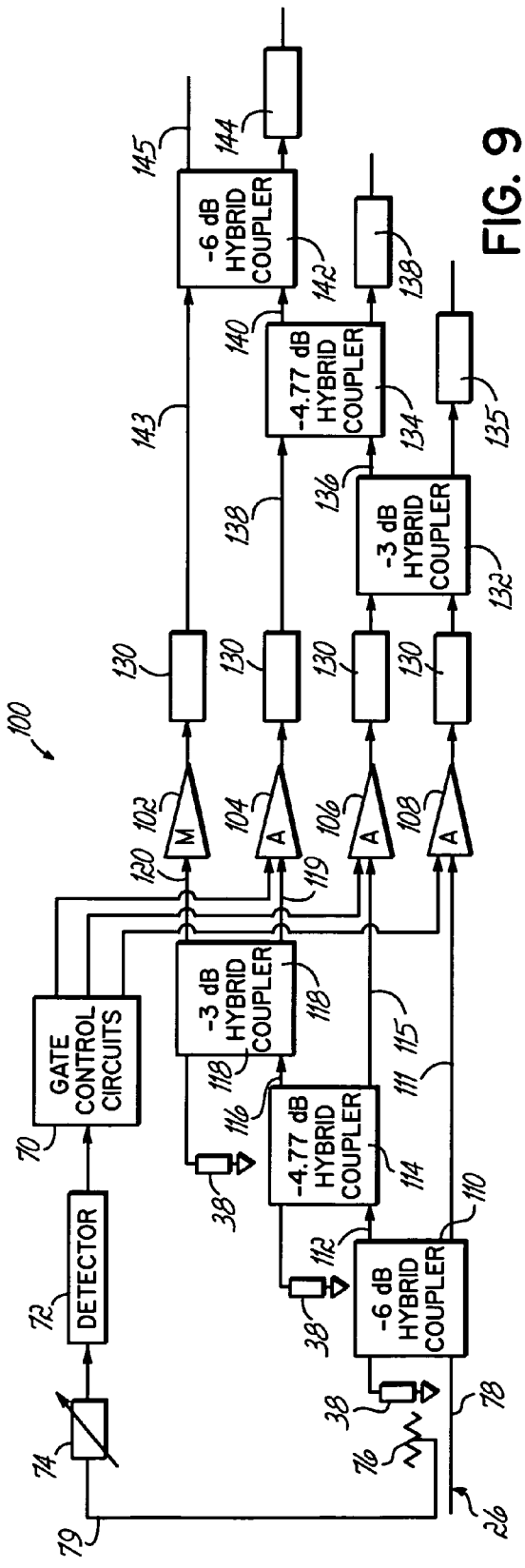

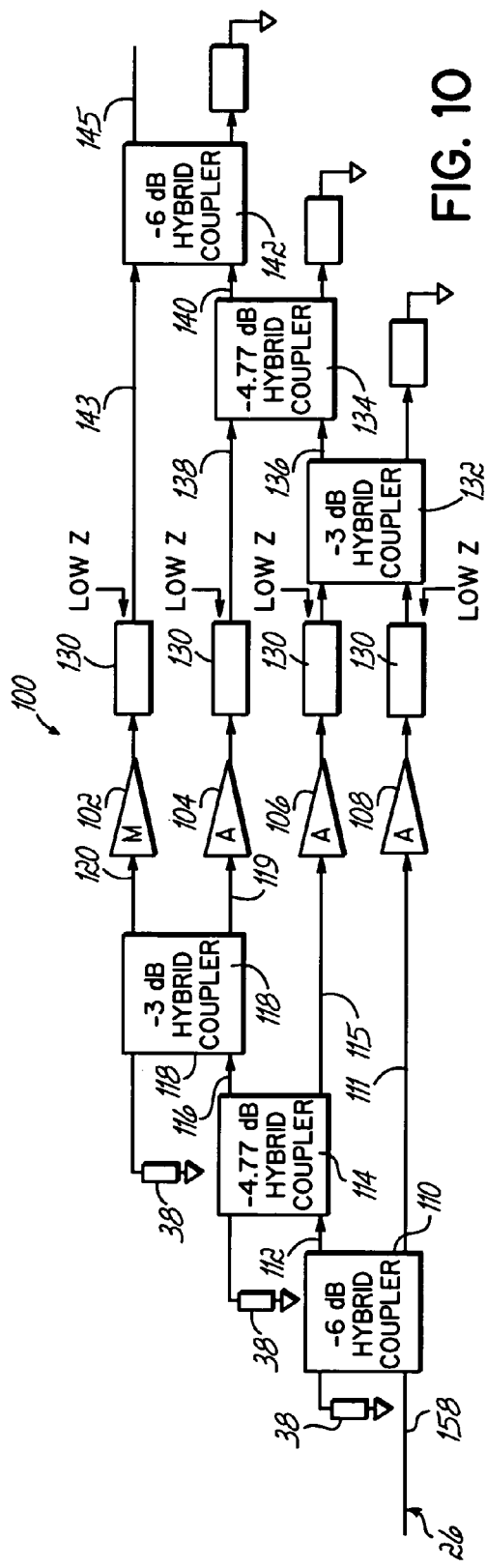
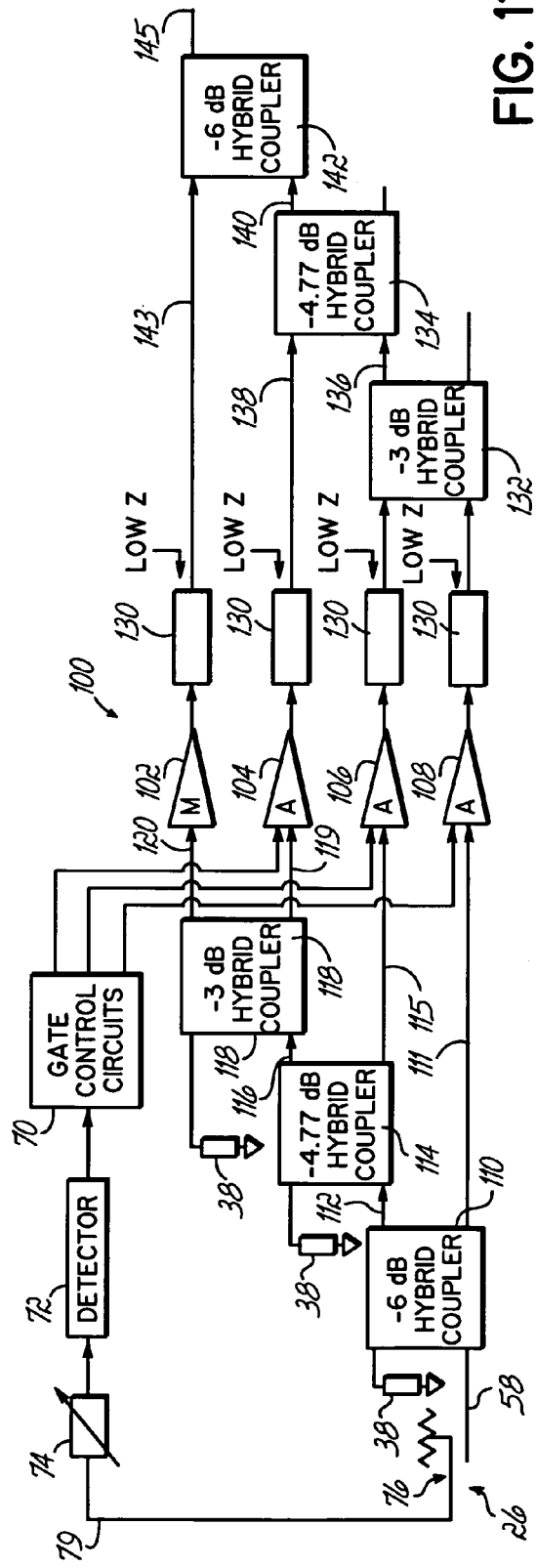
FIG. 10
FIG. 11

HIGH EFFICIENCY AMPLIFIER AND METHOD OF DESIGNING SAME

RELATED APPLICATIONS

This application is a Continuation-In-Part Application of pending U.S. patent application Ser. No. 10/402,800, entitled "High Efficiency Amplifier," filed Mar. 28, 2003.

FIELD OF THE INVENTION

The present invention relates generally to RF amplifiers, such as those used for wireless communications, and more specifically to RF amplifiers for handling significant peak-to-average ratio power applications and the efficient design thereof.

BACKGROUND

RF amplifiers are utilized for a variety of applications in wireless communication systems, such as to amplify or transmit a downlink signal at a base station. As a result, the amplifiers must be able to handle the power requirements associated with such wireless communication systems. Some wireless applications have high peak-to-average signal ratios, and those amplifiers used for applications having high peak-to-average signal ratios must be able to handle or deliver significant peak power levels above their normal or average load. For example, in order to amplify a signal with a 10 dB peak-to-average ratio, while creating a minimal amount of non-linear distortion, an amplifier must be capable of delivering around 200 watts of power to generate an output signal with an average power of 20 watts.

The transistors used for the amplification in wireless RF amplifiers actually run most efficiently when they are outputting close to their maximum power capability, or are operating in a saturated mode. However, saturation also leads to signal distortion. Typically, the closer to saturation an amplifier is operated, the greater the amount of nonlinear distortion it outputs. Therefore, it has become standard practice to decrease or "back off" the amplifier power output of a particular amplifier until the nonlinear distortion is at an acceptable level. As a result, for handling high peak-to-average signal ratio applications in an amplifier, several amplification devices or amplifiers are usually operated together and have their outputs combined. In such an amplifier, the devices or sub-amplifiers are operated inefficiently most of the time at low power in order to be able to deliver, somewhat more efficiently, the maximum power for the relatively short period of time when the high peaks in the signal are to be amplified.

Techniques have been developed to improve linearity in order to more efficiently deliver the desired power requirements for certain wireless communication applications. Several linear circuit architectures familiar to those skilled in the art of amplifier design have been developed (e.g., feedforward, cross-cancellation, pre-distortion, etc.). Furthermore, to improve the efficiency of such architectures, amplification design has employed numerous transistor technologies (e.g., LDMOS, GaN, SiC, and Bipolar, etc.), as well as various amplifier architectures (e.g., Doherty, LINC, Envelope Elimination and Restoration, Bias Adaptation, etc.).

The Doherty amplifier architecture improves amplifier efficiency by effectively reducing the amplifier's saturated power level when the signal level is low, yet quickly ramping up to full power capability when the signal peaks demand it. Classically, the Doherty design uses quarter-wavelength transmission lines as impedance transforming and inverting elements, which are somewhat large, and generally are not readily reduced for surface mounting on printed circuit boards. Additionally, in some instances these quarter-wavelength transmission lines may limit the bandwidth over which the amplifier can efficiently operate. Furthermore, it is often difficult to implement the classic Doherty design for low frequencies because of the physical size of quarter-wavelength transmission lines.

The parent application U.S. patent application Ser. No. 10/402,800 addresses various of the drawbacks of the prior art and provides efficient and linear amplification. However, it is still desirable to improve upon the design characteristics of such an amplifier for improving its fabrication, reliability and performance.

Accordingly, it is desirable to further improve the amplification schemes for RF applications associated with high peak-to-average signals ratio. It is also further desirable to address the drawbacks in the prior art by providing efficient and linear amplification, during both low power and high power peak requirements. These, and other objectives, are addressed by the invention described and claimed herein.

BRIEF DESCRIPTION OF FIGURES

The accompanying drawings, which are incorporated in and constitute a part of this specification, illustrate embodiments of the invention and, together with a general description of the invention given above, and the detailed description of the embodiments given below, serve to explain the principles of the invention.

FIG. 8 is a block diagram of an alternative embodiment of an amplifier circuit in accordance with the principles of the present invention utilizing multiple auxiliary amplifiers.

FIG. 9 is a block diagram of another alternative embodiment of an amplifier circuit in accordance with the principles of the present invention utilizing multiple auxiliary amplifiers.

FIG. 10 is a block diagram of another alternative embodiment of an amplifier circuit in accordance with the principles of the present invention utilizing multiple auxiliary amplifiers.

FIG. 11 is a block diagram of another alternative embodiment of an amplifier circuit in accordance with the principles of the present invention utilizing multiple auxiliary amplifiers.

DETAILED DESCRIPTION

Figure 1:
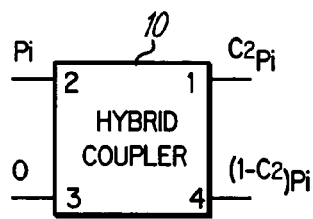
FIG. 1 is a block diagram of a hybrid coupler circuit.

The objectives noted above, as well as other objectives, are addressed by the present invention, which provides a high efficiency amplifier architecture for efficiently handling high peak-to-average signal ratio applications. The amplifier does so, without complicated and expensive electronics and RF switches. Furthermore, the amplifier is viable with linearization schemes, including digital, analog, and hybrid pre-distortion, Feed Forward, and Cross Cancellation. Furthermore, it is compatible with drain bias modulation schemes.

The present invention provides a new high efficiency power amplifier utilizing a load modulating scheme, like that of a classic Doherty amplifier, to improve amplifier efficiency when amplifying a signal with a high peak-to-average ratio. While utilizing some of the topology of a Doherty circuit in one embodiment of the invention, a new output topology is utilized to achieve the aspects of the present invention. To that end, some explanation of a classic Doherty circuit operation, which would be known to a person of ordinary skill in the art, is useful for understanding the operation of the present invention.

Generally, a simple Doherty circuit will combine the outputs of a main amplifier, such as a carrier amplifier and an auxiliary amplifier, such as a peaking amplifier. An input signal to the amplifiers is split, and the split signals are directed to the carrier amplifier and the peaking amplifier. The output of the carrier amplifier is combined through a quarter-wavelength impedance inverter with the output of the peaking amplifier, and the combined outputs are directed through a quarter-wavelength transformer to a load $Z_L$. The output of the peaking amplifier electrically acts like a current source and has a high output impedance. The output of the carrier amplifier acts like a current source and has a high output impedance until its output reaches saturation. After it reaches saturation, the output of the carrier or main amplifier looks like a voltage source and has low impedance.

Under a low input signal level drive condition, the peaking amplifier is turned OFF and its high output impedance is assumed to not significantly load the output circuit. The carrier amplifier's load impedance is then approximately 2 $Z_L$, which is approximately 2× the nominal design level and, thus, the amplifier operates at a similar nominal efficiency. When the input signal drive level is increased to where the carrier amplifier reaches saturation, the peaking amplifier is allowed to turn ON, thus contributing current to the output circuit. The additional current causes the effective impedance inverter's output to increase which, in turn, results in a decreasing load impedance at the carrier amplifier's output. As the input drive continues to rise, the carrier amplifier is kept in a voltage-saturated condition, but the power level of that saturated condition increases due to the decreasing load impedance. At the same time, the peaking amplifier is contributing power to the output of the amplifier. At the highest input drive level, both the carrier and peaking amplifiers have their designated nominal load impedance, $Z_L$, at their respective outputs, and are delivering their maximum rated power to the load.

The present invention, while utilizing the combination of a main and an auxiliary amplifier, does not utilize separate quarter-wavelength transmission lines at the output to form an impedance inverter and an impedance transformer to combine the amplifier output signals. Rather, the present invention utilizes a hybrid coupler in the output transforming/combining circuitry. This is a distinctive difference from the prior art. The output coupler provides significant advantages and is significantly simpler to implement than the classic Doherty design with quarter-wavelength lines. For example, hybrid couplers are commercially available and can be surface-mounted on a printed circuit board. Since the surface-mounted hybrid couplers are typically implemented with higher dielectric constant materials, they can be physically smaller than quarter-wavelength transmission lines used in the classic Doherty design. Use of a hybrid coupler provides for a wider bandwidth response for the amplifier than available with the classic Doherty circuit. Furthermore, use of the hybrid couplers allows the invention to be extended to low frequencies, which were difficult to implement with large quarter-wavelength transmission lines. Accordingly, the present invention provides significant benefits over the classic Doherty design.

The present invention utilizes a hybrid coupler as the combining circuitry for the outputs of the main and auxiliary amplifiers. Therefore, a brief explanation of the operation of a hybrid coupler is helpful in understanding the invention.

Referring to FIG. 1, a hybrid coupler 10 is illustrated as having port numbers 1–4. As discussed, ports 2 and 3 might be considered input ports and ports 1 and 4 as output ports. Generally, if ports 1, 3 and 4 are terminated in the coupler's characteristic impedance, such as, but not restricted to, 50 Ohms, and an input signal is applied to port 2, a portion of the input signal's power $P_i$ appears at port 1, and the remaining portion of the input signal's power appears at port 4. Ideally, little or no power would appear at the output of port 3. Generally, as understood by a person of ordinary skill in the art, the output signal portions at port 4 will have a phase that is shifted −90 degrees relative to the output signal portion at port 1. A similar operation occurs when port 2 is terminated and an input signal is applied to port 3. Ideally, no power would appear at port 2. The signal portion at port 1 will have a phase that is shifted. −90 degrees relative to the output signal portion at port 4. An example of a very common hybrid coupler is a −3 dB hybrid coupler, which generally splits an input signal, such as at port 2, equally between the output ports 1 and 4. in the present invention, the hybrid coupler utilized may be implemented in many different ways. For example, the hybrid coupler 10 in FIG. 1 may be implemented utilizing transmission lines, coupled transmission lines, lumped element inductors and capacitors, and transformers. In one embodiment of the invention, a coupled transmission line design is utilized for a coupler design in the >500 MHz region. However, the new system does not preclude the use of other implementations. For example, an implementation of the hybrid coupler for an HF, or VHF, high efficiency amplifier may utilize a transformer.

Figure 2A:
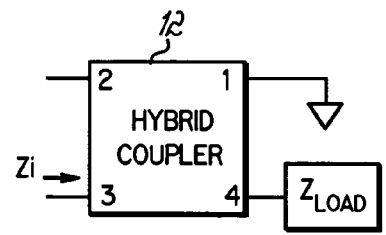
FIG. 2A is a block diagram of combining circuitry for an amplifier in accordance with one aspect of the present invention.
Figure 2B:
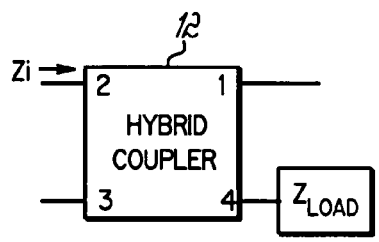
FIG. 2B is a block diagram of combiner circuitry in accordance with another aspect of the present invention.

FIGS. 2A and 2B illustrate two different hybrid coupler termination schemes applicable to combining output signals for the current high efficiency power amplifier invention.

In FIG. 2A, for hybrid coupler 12, port 1 of the hybrid coupler is terminated in a short circuit and port 4 is terminated in a load impedance $Z_{LOAD}$, which could match the characteristic impedance of the coupler, for example. Port 2 is left unterminated or as an open circuit. In such a case as illustrated in FIG. 2A, and where the coupler is a −3 dB design, the input impedance $Z_i$ is equal to $2 Z_{LOAD}$.

An alternative configuration is illustrated in FIG. 2B, wherein port 1 of the hybrid coupler 12 is terminated in an open circuit, rather than being shorted, and port 4 is terminated in the characteristic impedance of the coupler $Z_{LOAD}$. Port 3 is left un-terminated or as an open circuit. In this case, the input impedance $Z_i$ is also equal to $2 Z_{LOAD}$ for the case of a −3 dB hybrid coupler. The coupler arrangements of FIGS. 2A, 2B are utilized to combine the outputs of main and auxiliary amplifiers in accordance with the principles of the invention.

Figure 3A:
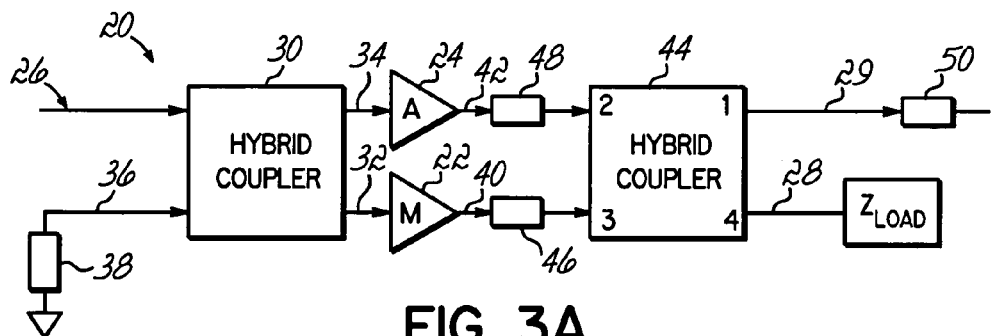
FIG. 3A is a block diagram of an embodiment of an amplifier circuit in accordance with the principles of the present invention.
Figure 3B:
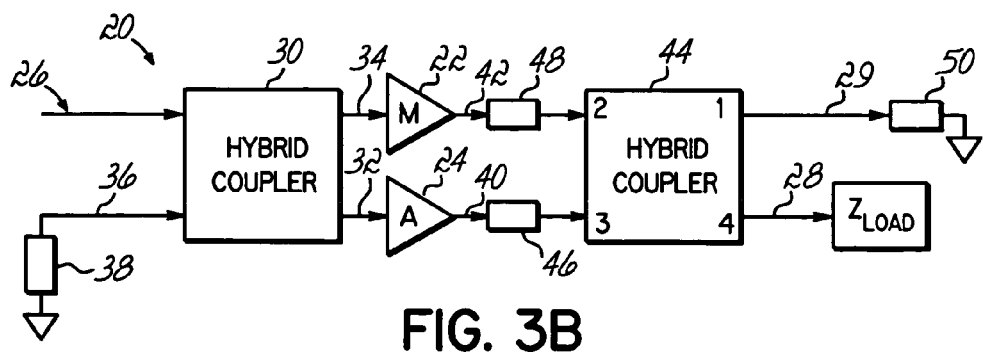
FIG. 3B is a block diagram of another embodiment of an amplifier circuit in accordance with the principles of the present invention.

FIGS. 3A and 3B illustrate embodiments of the invention utilizing a main amplifier circuit and an auxiliary amplifier circuit, with outputs coupled through a hybrid coupler in accordance with the principles of the present invention. FIG. 3A illustrates a block diagram of one embodiment of the invention wherein the amplifier 20 incorporates a main amplifier circuit or carrier amplifier 22 and an auxiliary amplifier circuit or peaking amplifier 24. In accordance with one aspect of the present invention, the auxiliary amplifier circuit 24 is selectively operable to operate at selected times in combination with the main amplifier circuit 22. That is, the auxiliary amplifier circuit 24 may be kept OFF until peak power requirements call for a higher power output from the amplifier 20, at which time it is turned ON and operated to increase the power output of the amplifier 20. Herein, the term "selectively operable" indicates the amplifier operational state changes in response to an external signal. That external signal may be, but is not limited to, the input signal to be amplified, an analog control signal, or a digital control signal. For example, the operational state of a Class-C amplifier changes in response to its input signal. Herein, the term "amplifier circuit" is utilized to indicate various amplifier components, which operate to amplify a signal and which may themselves be parts of a larger overall amplifier, such as amplifier 20. The term "amplifier circuit" is, therefore, not limited to a single amplifier or single stage of amplification. For example, each of the main amplifier circuit 22 and auxiliary amplifier circuit 24 might incorporate various stages of amplification, but will be referred to herein generally as amplifier circuits.

Generally, amplifier 20 includes a main amplifier input or primary amplifier input 26 and an amplifier output 28. That is, an RF signal input at 26 is amplified and presented at output 28 to a load or effective load impedance $Z_{LOAD}$, although the amplifier output 28 may include combined amplified signals from the main amplifier circuit 22 and auxiliary amplifier circuit 24 in accordance with the invention.

The input signal 26 is divided between the main amplifier circuit 22 and auxiliary amplifier circuit 24. In accordance with one aspect of the present invention, an input hybrid coupler circuit 30 is utilized for splitting the input signal 26 into individual signals or signal components 32, 34. Signal 32 from the splitting coupler 30 is coupled as an input signal to main amplifier circuit 22, while signal 34 is coupled as an input signal to auxiliary amplifier circuit 24. The coupler circuit 30 therefore acts as a splitting coupler circuit to split or divide the input signal 26. The division ratio of the coupler determines the relative amplitude of signals 32 and 34. This division ratio may be used to partially determine the selectively operable characteristics of the auxiliary amplifier. In one embodiment of the invention, the hybrid coupler circuit 30 is a −3 dB hybrid coupler. The −3 dB coupler circuit 30 divides the input signal 26 into generally equal amplitude input signals 32, 34 for the amplifier circuits 22, 24. The other input 36 of the coupler circuit 30 is terminated through a suitable impedance such as a 50 Ohm resistor 38 to ground. The divided or split signals are then amplified respectively by the main amplifier circuit 22, or the main amplifier circuit in combination with the auxiliary amplifier 24. The amplifier circuits are also designated in the figures as "M" and "A" for "main" and "auxiliary." As noted, the auxiliary amplifier circuit is selectively operable to operate in combination with main amplifier circuit 22 when needed for peak power requirements or applications.

In accordance with an aspect of the present invention, a hybrid coupler circuit 44 is coupled with the outputs of the main amplifier circuit 22 and the auxiliary amplifier circuit 24. Specifically, amplified output signals 40, 42 are coupled to the input ports 3, 2, respectively, of coupler circuit 44. The hybrid coupler circuit 44, similar to hybrid coupler circuit 30, may be a −3 dB hybrid coupler, for example. In accordance with one aspect of the present invention, and discussed further herein below, phasing lines 46, 48 are coupled at the amplifier circuit outputs 40, 42 and in-line between the amplifier circuits 22 and 24, respectively, and the output hybrid coupler circuit 44. Generally, the phasing lines 46, 48 are short lengths of transmission line, which have a selectable length and are used to present a desired characteristic impedance to the input of the coupler circuit 44. The phasing lines 46, 48 are selected to operate in conjunction with any output matching circuitry of the amplifier circuits, as discussed below, to maximize or minimize the effective amplifier output impedance $Z_{out}$, depending on the hybrid coupler configuration to be used. In one embodiment, the auxiliary amplifier circuit 24 is selectively operable to be turned ON and OFF as needed to handle power requirements. In an alternative embodiment, the main amplifier 22 might also be selectively operable to turn it OFF.

The hybrid coupler circuit 44 is operable to combine the amplifier circuit outputs at output port 4 as a coupler first output 28, which is reflective of the output from amplifier 20. The present invention terminates the other output port 1 with one of an electrical short or electrical open circuit. This may be done directly at the port or spaced from the port by utilizing a tuned open-circuit transmission line 50, as illustrated in FIGS. 3A, 3B. The tuned open-circuit transmission line has a length selected to generally reflect the desired short circuit or open circuit to the respective output port 1 of the hybrid coupler 44. Specifically, the open-circuit transmission line 50 may be in the form of a length of transmission line, such as a length of co-axial cable, which is specifically tuned or dimensioned to provide an efficient output 28 for the amplifier 20. FIG. 3A is reflective of a hybrid coupler configuration, as illustrated in FIG. 2A wherein output port 1 is terminated in a short using an open circuit transmission line 50 to reflect an electrical short to port 1 of the hybrid coupler circuit 44. Alternatively, an effective short circuit might be physically located directly adjacent to port 1 of the hybrid coupler, similar to the configuration as illustrated in FIG. 2A. However, the transmission line section 50, such as a quarter-wavelength (90 degree) transmission line will allow the termination, whether a short or open circuit, to be moved away from the coupler port. In accordance with the aspects of the present invention, the length of the open circuit transmission line 50 is selected to reflect one of an electrical short or an electrical open circuit at output port 1.

FIG. 3B illustrates an alternative embodiment of the invention, wherein an open circuit is used for the termination of port 1, such as wherein a length of transmission line 50 is selected with a short at one end to reflect an open circuit to the hybrid coupler circuit 44. In FIGS. 3A and 3B, like components are given similar reference numerals. In the FIG. 3B embodiment, the position of the main (M) amplifier circuit, or carrier amplifier 22 and the position of the auxiliary (A) amplifier circuit, or peaking amplifier 24, are reversed with respect to the embodiment as illustrated in FIG. 3A.

For both of the configurations illustrated in FIGS. 3A and 3B, the operation of the amplifier might be considered in a similar fashion as the operation of a classic Doherty system, upon which the invention improves. In the case of −3 dB couplers, when the input power at input 26 is low, the auxiliary (A) amplifier circuit or peaking amplifier 24 is turned OFF, and its output looks like an open circuit. At that power level, the carrier amplifier load is 2 $Z_{LOAD}$. As the signal level is increased and the peaking amplifier 24 is turned ON, the load impedance for the carrier amplifier 22 will gradually decrease to the nominal design $Z_{LOAD}$.

In accordance with one aspect of the present invention, the auxiliary amplifier circuit 24 is selectively turned ON and OFF as needed for peak power requirements. As such, there may be a significant amount of time in which only the main amplifier circuit 22 is operating. The present invention, with a short or open circuit presented to the port 1 of the coupler, provides significant advantages to simply terminating the port with the characteristic impedance of the coupler. In a hybrid coupler having one output port (e.g. port 1) terminated through a characteristic impedance, such as a 50 Ohm resistor to ground, a 6 db power loss would be realized when the auxiliary amplifier circuit is OFF. For example, should one of the amplifier circuits be OFF, such as the auxiliary amplifier circuit 24, half the power of the remaining amplifier will be lost through the 50 Ohm terminated output of the coupler circuit. This results in a 6 dB loss, including a 3 dB loss from the auxiliary amplifier circuit being turned OFF, and another 3 dB loss because approximately half of the remaining amplifier's power (main amplifier circuit) is lost through the 50 Ohm termination load. Even if the auxiliary amplifier is not completely OFF, if one of the amplifiers changes its output significantly (e.g., in amplitude or phase), then a proportional amount of the power is lost through the 50 Ohm termination load as a function of the difference between the outputs.

Generally, the length of the transmission line, 50, or its impedance characteristics, are selected so that an electrical short or an electrical open circuit is reflected back into the coupler circuit 44. Once selected or tuned to provide the desired electrical short characteristics to the coupler circuit output port, the characteristics of the transmission line may essentially remain set as tuned. Therefore, if the length or width of the transmission line 50 is varied to change its electrical length or impedance characteristics, it may remain at the selected length or width regardless of whether the auxiliary amplifier circuit 24 is ON or OFF. Alternatively, the transmission line 50 might have a selectable effective length and effective impedance characteristic for possibly dynamically varying its effect on the circuit of the invention, although such dynamic adjustments may not be necessary.

As such, this new amplifier architecture allows additional amplifiers, such as additional auxiliary (A) amplifier circuits, to be added when increased power is required such as to handle peak power applications. When not needed, the auxiliary amplifier circuits can be shut OFF or their outputs reduced without a significant combining loss of signal amplitude. The main amplifier circuit may be operated efficiently with as little distortion as possible, and the auxiliary amplifier circuit may be selectively utilized as efficiently as possible. Therefore, the efficiency of the amplifier is significantly improved, while it is still able to handle peak power requirements.

As noted above, for typical Doherty amplifier operation, below saturation, both the main amplifier and auxiliary amplifier output impedances need to be high, such that they act as current sources. However, in most peaking and carrier amplifiers, the final stage device, usually a transistor, is followed by a matching network that transforms a convenient impedance level at the amplifier output (usually, but not restricted to, 50 Ohms) to a less convenient impedance level (perhaps, on the order of 2 Ohms), at the transistor terminals.

Figure 4:
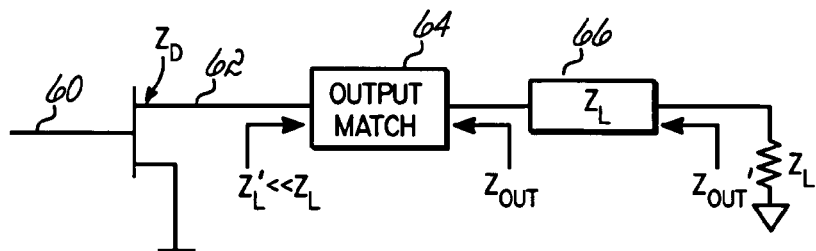
FIG. 4 is a block diagram illustrating output impedance characteristics of an amplifier.

Referring to FIG. 4, an illustrative output circuit is shown, showing an output matching network in combination with a phasing line for achieving a desirable impedance for the output of the amplifier circuits as they couple to the combining hybrid coupler 44 according to the invention. Specifically, the output terminal 62 of an amplifier transistor 60 is coupled with a matching network 64 to achieve a low impedance level $Z_L'$. The value of $Z_L'$ is chosen to obtain optimal performance from the transistor device 60. Generally, depending upon the exact topology utilized for the matching network 64, an impedance inversion may occur. A matching network that causes an impedance inversion will cause the output impedance $Z_{out}$ to be low when the transistor output impedance $Z_D$ is high. In addition, when the output matching network 64 causes an impedance inversion, it is necessary to load the amplifier circuit with an impedance that is lower than the nominal design level (i.e. $<Z_L$) to have the amplifier operate in a more efficient mode. It should also be noted that, in this mode of the operation, the gain of the amplifier increases with decreasing load impedance. Such a condition is reflective of an inverted mode of a Doherty amplifier operation. In the present invention, and again referring to FIG. 4, the output impedance $Z_{out}$ will not be at the maximum possible value when a high $Z_{out}$ is desired. Similarly, the output impedance will not be at a minimum when a low $Z_{out}$ is desired. Therefore, in accordance with another aspect of the present invention, a short length of transmission line 66 is selected, having a characteristic impedance $Z_L$. The length of transmission line 66 is coupled between the output matching circuit and the load $Z_L$, as shown in FIG. 4. In accordance with the principles of the present invention, the phasing line 66, is selected to maximize or minimize $Z_{out}'$, depending upon the configuration of the amplifier to be utilized in the position of the main amplifier circuit and the auxiliary amplifier circuit.

Figure 5A:
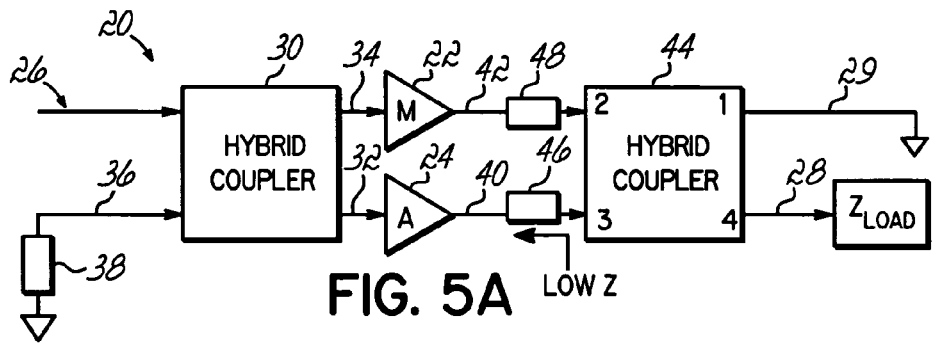
FIG. 5A is a block diagram of an alternative embodiment of an amplifier circuit in accordance with the principles of the present invention.
Figure 5B:
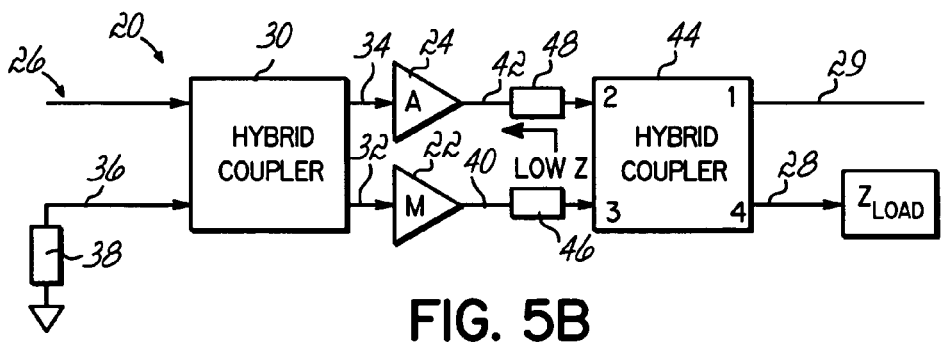
FIG. 5B is a block diagram of another alternative embodiment of an amplifier circuit in accordance with the principles of the present invention.

FIGS. 5A and 5B illustrate basic configurations of the high efficiency amplifier of the invention when operating in the inverted mode, i.e. when the transistor output has high impedance and the output matching network causes an impedance inversion, such that the output impedance is low. Referring to FIGS. 5A and 5B, they are similar to the configurations as utilized in FIGS. 3A and 3B, but the physical location of the main (M) amplifier circuit (carrier amplifier) and auxiliary (A) amplifier circuit (peaking amplifier) are reversed from their positions illustrated in FIGS. 3A and 3B. In this mode of operation, when the peaking amplifier is turned OFF, the carrier amplifier load is $c^2 Z_L$, which is lower than the nominal design value of $Z_L$. In the case where a −3 dB coupler is used, the carrier amplifier would see an impedance of approximately $Z_L/2$. As the input signal is increased, the peaking amplifier is turned ON, the load impedance on the carrier amplifier will gradually increase to the nominal design value of $Z_L$. For this configuration, the lengths of phasing lines 46, 48 and their effect, are chosen to achieve the desired low $Z_{out}'$ being presented to the input of coupler 44. This is in contrast to the case shown in FIGS. 3A and 3B, where the lengths of phasing lines 46, 48, and their effect, are chosen to achieve the desired high $Z_{out}'$ being presented to the input of coupler 44.

Generally, the choice of the mode of operation, such as the noninverted mode, illustrated in FIGS. 3A and 3B, or the inverted mode, as illustrated in FIGS. 5A and 5B, is best determined after the peaking and carrier amplifier matching circuit designs are complete. When the resultant amplifier impedances are high, those topologies illustrated in FIGS. 3A and 3B are preferable. When the resultant amplifier impedances are low, those topologies illustrated in FIGS. 5A and 5B are preferable.

In one embodiment of the present invention, main amplifier circuits and auxiliary amplifier circuits with generally equal power output capabilities, or power ratings, are utilized. As such, the hybrid couplers 44 utilizing the output may be −3 dB hybrid couplers, which are suitable for amplifiers with equal output power ratings. Alternatively, when amplifying signals with sufficiently high peak-to-average ratios, it may be advantageous to use an auxiliary or peaking amplifier with a higher output rating than the main or carrier amplifier. For example, the auxiliary amplifier might be rated at twice the output power of the carrier amplifier. In such a case, and in accordance with the various embodiments of the invention described herein, the design of the coupler may be selected to address any differences between the output power ratings of the various amplifier components. For example, for an auxiliary amplifier rated at twice the output power of the main amplifier, a −4.77 dB design may be utilized. Generally, the choice of input coupler value for the combining hybrid coupler 44 depends upon the relative gains of the main and auxiliary amplifiers. Generally, the various configurations shown in the Figures herein can be designed to operate with any ratio of auxiliary amplifier to main amplifier power ratings.

In the present invention, as with the classic Doherty amplifier, as the relative size of the peaking amplifier is increased, the output power at which the amplifier reaches its first efficiency peak, will decrease. The plot in FIG. 6 indicates this effect. The vertical axis is amplifier efficiency (1=100%), while the horizontal axis is the output signal voltage level relative to the maximum rating. The $\alpha=0.5$ curve represents the ideal result, when the auxiliary amplifier and the main amplifier have the same output power rating. The $\alpha=0.25$ curve represents the ideal result, when the auxiliary amplifier's output power rating is three times (3×) that of the main amplifier.

Figure 6:
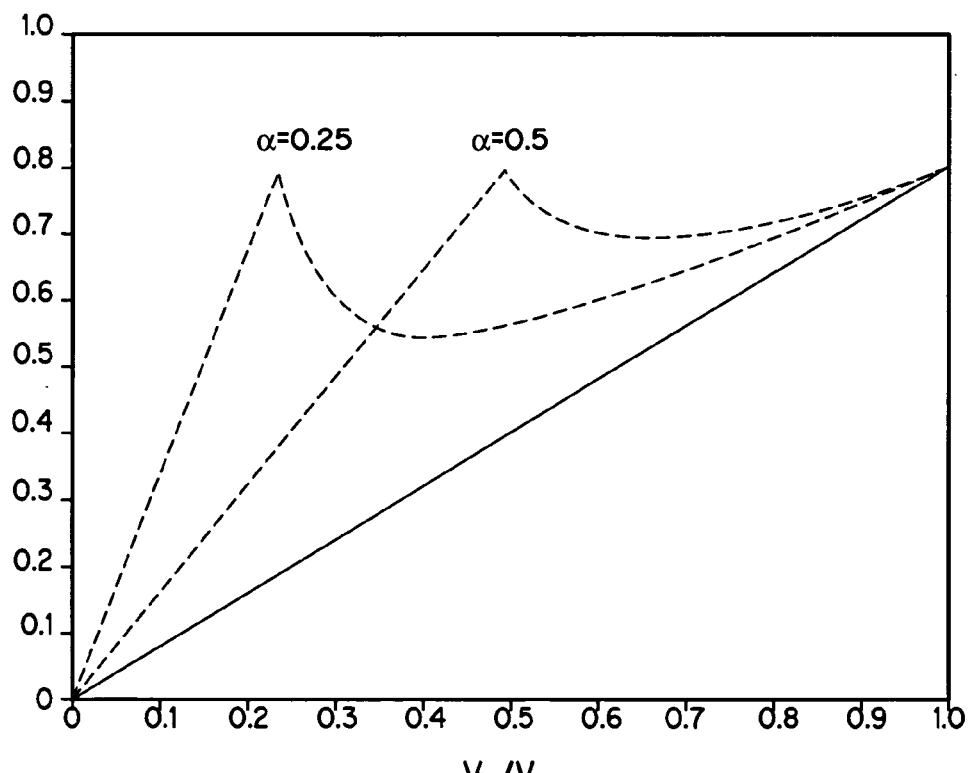
FIG. 6 is a plot of amplifier efficiency for the embodiments of the present invention.
Figure 7:
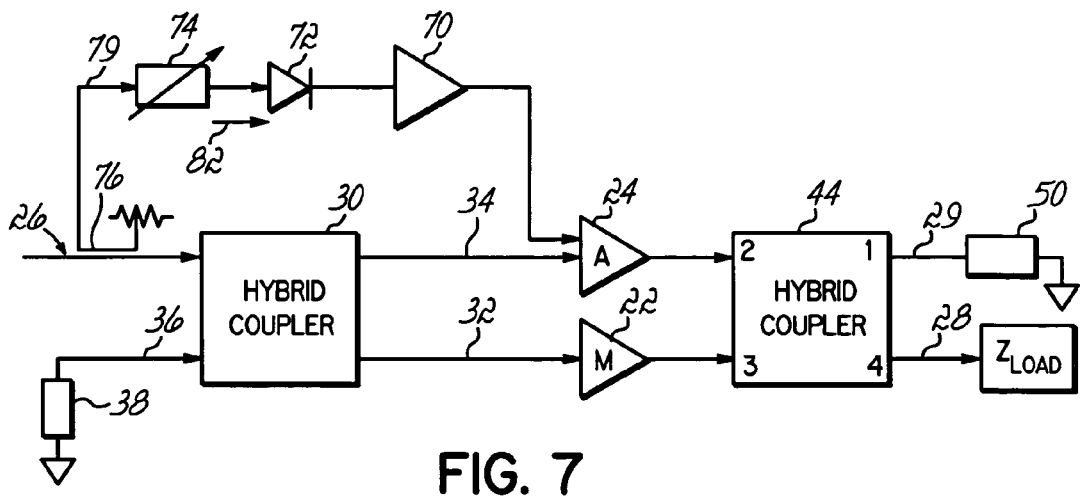
FIG. 7 is a block diagram of an alternative embodiment of an amplifier circuit in accordance with the principles of the present invention.

In accordance with another aspect of the present invention, it may not be possible to achieve the desired efficiency curves, such as those in FIG. 6, using standard RF transistors because of their turn ON characteristics. Rather, as illustrated in FIG. 7, a gate control circuit 70 may be utilized to control turn ON characteristics of auxiliary amplifier circuit 24. As noted above, the main amplifier circuit 22 might also be selectively operated to be turned ON and OFF and, therefore, may also use the gate control circuit 70. However, for the purpose of illustration, the gate control circuit 70 will be described with respect to its use with auxiliary amplifier circuit 24. Similar reference numerals are utilized for similar components as described above.

A detector 72 detects the instantaneous power at the input 26 and an attenuator 74 might be utilized to adjust or condition the input signal delivered to the detector. The output of the detector is an input to the gate control circuit 70. A portion of the input signal 26 is coupled off by a coupler 76 with a portion of the signal provided to hybrid coupler circuit 30 and another portion 79 of the signal provided to the gate control circuit 70.

Based upon the level of the signal 79 detected by the detector 72 in the gate control path 82, the gate control circuit 70 is operated to control the turn ON characteristics of the auxiliary amplifier circuit 24. Specifically, the gate (or base or grid) biases are modulated to thereby control the TURN ON characteristics. Various different techniques for such gate bias modulation and gate control are known to those skilled in the art and such appropriate techniques may be utilized. This allows the auxiliary amplifier 24 to remain turned OFF until a higher input signal level is reached, while still allowing the auxiliary amplifier to reach its full output capability at the peak input signal level. As discussed further herein below, the use of gate control may be used with any of the disclosed embodiments.

FIGS. 8 and 9 illustrate alternative embodiments of the invention utilizing a plurality of auxiliary (A) amplifier circuits in addition to a main (M) amplifier circuit. That is, the invention may be extended to cases with more than two amplifiers. The plurality of auxiliary amplifier circuits are selectably operable to be operated in various combinations with the main amplifier circuit. Therefore, the amplifier of the invention may handle peak power applications at more numerous incremental power increases to achieve greater efficiency.

FIG. 8 illustrates one embodiment of the invention utilizing multiple amplifiers, arranged in a serial combiner arrangement. To that end, the hybrid coupler circuits will have different coupling characteristics as appropriate for controlling the level of input signal to the various amplifiers in such a serial feed and output combination. Similar reference or numerals are utilized for the similar components as discussed above with other embodiments. For amplifier 100, the main amplifier circuit 102 is utilized in combination with three auxiliary amplifier circuits 104, 106, 108. As noted above, although the embodiments illustrated herein show various numbers of auxiliary amplifiers, such illustrated embodiments are not limiting and a greater or lesser number of amplifier circuits, both main and auxiliary, might be utilized. As noted, common reference numerals are utilized for common components as discussed in the embodiments above.

An input signal 26 is input to the hybrid coupler circuits, and is directed on a path to coupler circuits 110, 114, 118, which further split the signal. Signal 26 is directed to a first hybrid coupler, such as a −6 dB hybrid coupler circuit 110. One output signal 111 from an output port of hybrid coupler circuit 110 is directed to auxiliary amplifier 108, while another output 112 is directed to a second hybrid coupler circuit 114, which may be a −4.77 dB coupler. The coupling value of the various couplers may vary based upon the serial feed arrangement in order to input generally equal signals to the various main and auxiliary amplifier circuits 102–108. The arrangement shown in FIGS. 8 and 9 assumes generally equal power output capabilities for the main and auxiliary amplifiers. Alternatively, different sized amplifiers might be used and the coupler values adjusted accordingly to adapt to unequal power ratings for the amplifiers.

The output 115 from the hybrid coupler circuit 114 is directed to auxiliary amplifier circuit 106, while another output 116 is directed to coupler circuit 118. Coupler circuit 118 may be a −3 dB coupler with its respective outputs 119, 120 being directed to the auxiliary amplifier 104 and the main amplifier 102, respectively. A serial arrangement to divide the input signal among the various amplifier circuits 102–108 is reflective of the serial combiner arrangement utilized at the output, as discussed further below.

The output signals of the main and auxiliary amplifier circuits 102–108 are coupled through phasing lines 130 to coupler circuits 132, 134, 142 arranged in a serial combiner arrangement. The outputs of auxiliary amplifiers 106, 108 are directed to coupler circuit 132, such as a −3 dB coupler. One output signal 136 of the coupler circuit 132 is directed to another hybrid coupler circuit 134, while the other output port is coupled to a tuned transmission line 135, which is tuned to reflect an electrical short to the coupler circuit, as discussed above. The other output 136 is combined with an output 138 from auxiliary amplifier circuit 104. Coupler circuit 134, which may be a −4.77 dB coupler circuit, has one output port coupled to a tuned transmission line 138, while the other output 140 is fed to a hybrid coupler circuit 142, where it is combined with the output 143 from the main amplifier circuit 102. Coupler circuit 142 may be a −6 dB coupler as illustrated. Similarly, a tuned, open-circuited transmission line 144 is coupled with an output port of the coupler circuit 142 to reflect a short to that port. The other output 145 is reflective of the combined output from the various amplifiers and coupler circuits, and provides the output of amplifier 100. In operation, for example, main amplifier circuit 102 might be on while, in sequence, the auxiliary amplifier circuits 104, 106, 108 are turned ON according to the level of the input signal. The phasing lines in FIGS. 8 and 9 are selected so that the maximum output impedance is presented to the inputs of couplers 132, 134, and 142.

The embodiment of the invention illustrated in FIG. 8 might also be utilized with gate control as illustrated in FIG. 9, wherein like reference numerals are utilized to illustrate the gate control circuitry as in FIG. 7. Specifically, in FIG. 9, the coupler circuit 76 couples off a portion of the signal 79, which is directed to appropriate gate-controlled circuit 70 through an attenuator 74 and a detector 72. Outputs of the gate-controlled circuit are coupled appropriately to the turn ON characteristic of the auxiliary amplifier circuits.

Further alternative embodiments of the invention are illustrated in FIGS. 10 and 11, which show multiple amplifiers having low impedance characteristics, such as "inverted mode" characteristics and with and without gate control, respectively.

Referring to FIG. 10, with like numerals utilized to designate similar components as illustrated in FIGS. 8 and 9, various main and auxiliary amplifiers 102–108, in combination with their respective phasing lines, will reflect a low output impedance at the input ports of the couplers. While the phasing lines 130 are given common reference numerals between each of the amplifiers, that does not indicate that such phasing lines will have generally the same length. Rather, the lengths of the phasing lines are shown to maximize or, as in the case of FIGS. 10 and 11, minimize the output impedance (see FIG. 4). The main amplifier and auxiliary amplifiers are arranged as set forth in FIGS. 8 and 9, with the auxiliary or peaking amplifiers being biased to turn ON at increasing input drive levels. Similarly, the turn-ON sequence will be amplifier 104, then 106, then 108, in that order. Since FIGS. 10 and 11 illustrate an inverted-mode operation of a multiple amplifier circuit, phasing transmission lines 130 are set so that a low impedance is presented to input ports of the various hybrid coupler circuits 132, 134, and 142. However, rather than terminating the isolated ports of the hybrid coupler circuits with electrical short circuits, as illustrated in FIGS. 8 and 9, open circuits are presented at the isolated ports of the output couplers. While FIG. 10 illustrates a length of transmission line terminated in a short, might be utilized to reflect an open circuit and move the termination away from the coupler, a single open circuit at the output ports might also be utilized.

FIG. 11 is similar to FIG. 10 and illustrates utilization of a gate-controlled circuit for controlling the turn-ON bias for the auxiliary amplifiers.

As noted, with many of the embodiments illustrated herein, the power output capability of the amplifiers may be equal or unequal. Generally the hybrid coupler circuits and their coupling values may be chosen to reflect the relative amplifier power output capabilities. For various of the embodiments, particularly those utilizing two amplifiers, a −3 dB hybrid coupler may be suitable for main and auxiliary amplifiers with generally equal power output capabilities. Different coupler values, such as a −4.77 coupler, may be utilized for those situations in which the main and auxiliary amplifiers have unequal power capabilities.

Figure 12:
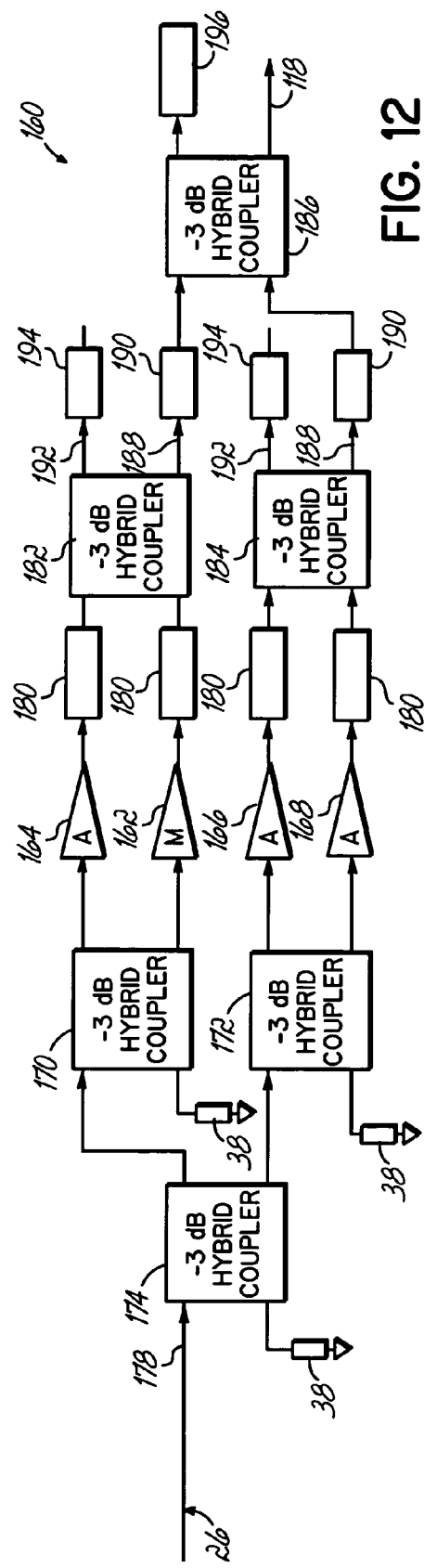
FIG. 12 is a block diagram of another alternative embodiment of an amplifier circuit in accordance with the principles of the present invention utilizing multiple auxiliary amplifiers.

The embodiments of FIGS. 8–11 are shown with a serial signal feed to the amplifiers. In an alternative multiple amplifier embodiment, a corporate or parallel feed arrangement might be used. Referring to FIG. 12, an amplifier 160 is illustrated, having a main amplifier circuit 162 and auxiliary amplifier circuits 164, 166, 168. The amplifier circuits are fed by a parallel or corporate signal divider arrangement, incorporating coupler circuits 170, 172, which may be −3 dB hybrid coupler circuits.

The plurality of amplifier circuits 162–168 are fed in a corporate arrangement and thus require multiple stages of hybrid coupler circuits. Therefore, a hybrid coupler circuit 174 is utilized to divide the incoming input signal generally equally between the coupler circuits 170,172, which then feed the amplifier circuits. Like numerals are utilized in FIGS. 12 and 13 for similar signal and circuit components, as discussed herein above with respect to other Figures. The input coupler circuits, or splitting coupler circuits 170, 172, 174, have one input terminated through a 50 Ohm resistor 38 to ground.

In accordance with the principles of the present invention, the auxiliary amplifier circuits 164, 166, 168, along with the main amplifier circuit 162, are coupled to hybrid coupler circuits 182, 184, 186 to combine their various outputs to a single RF output 118. To that end, the outputs of main amplifier circuit 162 and auxiliary amplifier circuit 164 are coupled through appropriate phasing lines 180 to respective coupler circuit 182. Similarly, the auxiliary amplifiers 166, 168 are coupled through phasing lines 180 to a respective coupler circuit 184. The outputs from the coupler circuits 182, 184 are then combined through another coupler circuit 186 to form output signal 118. The coupler circuits 182, 184, 186 may be −3 dB hybrid couplers as illustrated or some other suitable coupler circuit. The coupler circuits are arranged in a corporate combiner arrangement. In accordance with the principles of the invention, one of the outputs of each coupler circuit is the combined signal from the amplifier circuits or other components connected thereto. The other coupler output port is coupled to one of a short or open circuit, such as through a transmission line segment. Specifically, referring to FIG. 12, coupler circuit 182 has a first coupler output 188 which combines the amplifier output signals from amplifier circuits 162, 164 and passes them through to the coupler circuit 186. For signal conditioning, and to present a high impedance to the coupler circuit 186, a phasing line 190 is utilized between coupler circuit 182 and coupler circuit 186. Similarly, phasing line 190 may be utilized for the coupler circuit 184 and the output 188 thereof, which is reflective of the amplifier circuits 166, 168. The other coupler output 192 of each of the coupler circuits 182, 184 feeds to an open-circuit tuned transmission line 194, which is selected so that an electrical short is reflected back into the coupler circuits 182, 184 respectively. As noted above, generally the length of the open-circuit transmission line 194 will be determined and set for a specific amplifier circuit and respective coupler circuit and will remain tuned. The coupler circuit 186 is terminated by an open-circuit tuned transmission line 196, which is tuned for reflecting an open circuit back to the output port of the coupler circuit 186. Therefore, in accordance with the principles of the present invention, the outputs of the amplifier circuits are combined efficiently so that the auxiliary amplifier circuits may be selectively operated to provide a peak power output for the amplifier 160.

Figure 13:
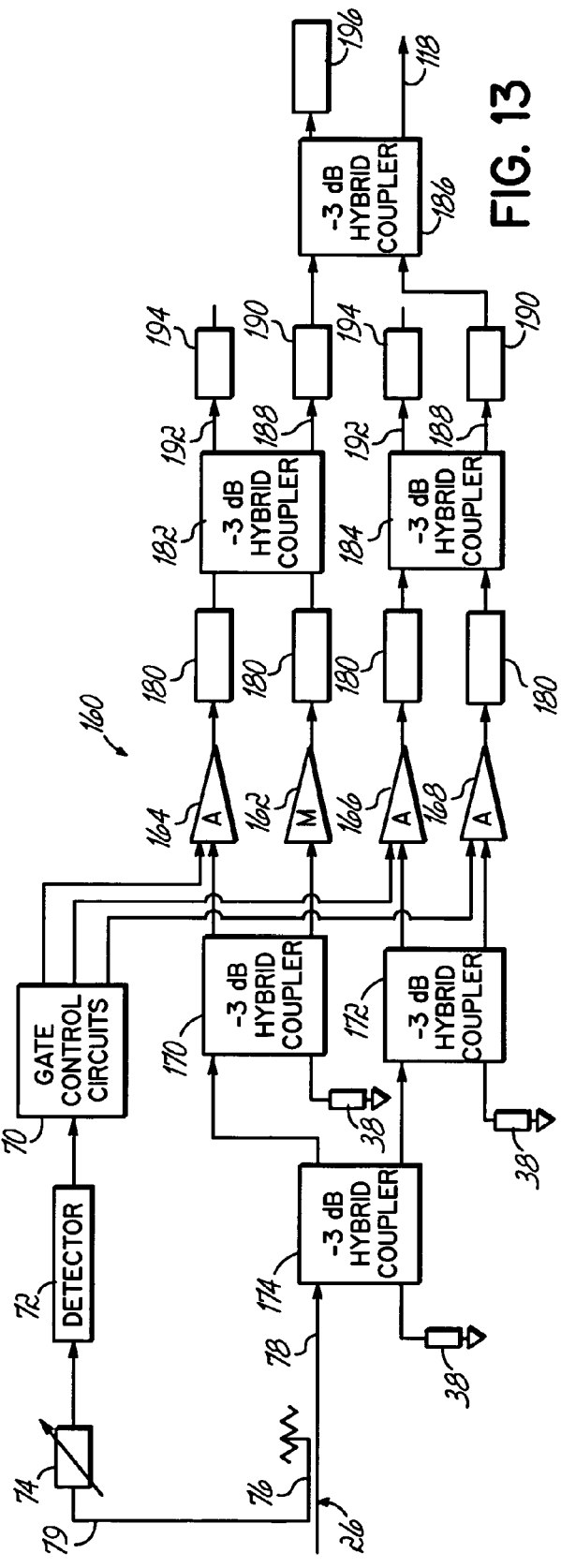
FIG. 13 is a block diagram of another alternative embodiment of an amplifier circuit in accordance with the principles of the present invention utilizing multiple auxiliary amplifiers.

In accordance with another embodiment of the present invention, as illustrated in FIG. 13, gate control circuit 70 may be operated to selectively turn ON the auxiliary amplifier circuits 164–168 as desired when signal peaks are detected by the detector 72. For example, main amplifier 162 may be ON and auxiliary amplifier 168 may be turned ON when a specific signal level is detected. As noted above, the gate control circuit 70 controls the turn ON characteristics of the auxiliary amplifier 168. As the detector 72 detects an increased input signal level, the gate control circuit 70 may be utilized to turn ON other auxiliary amplifier circuits, such as circuits 164 and 166. The coupler circuits 182, 184, and 186 combine the signals from the main and the auxiliary amplifier circuits into a single output 118 for the amplifier 160.

Figure 14:
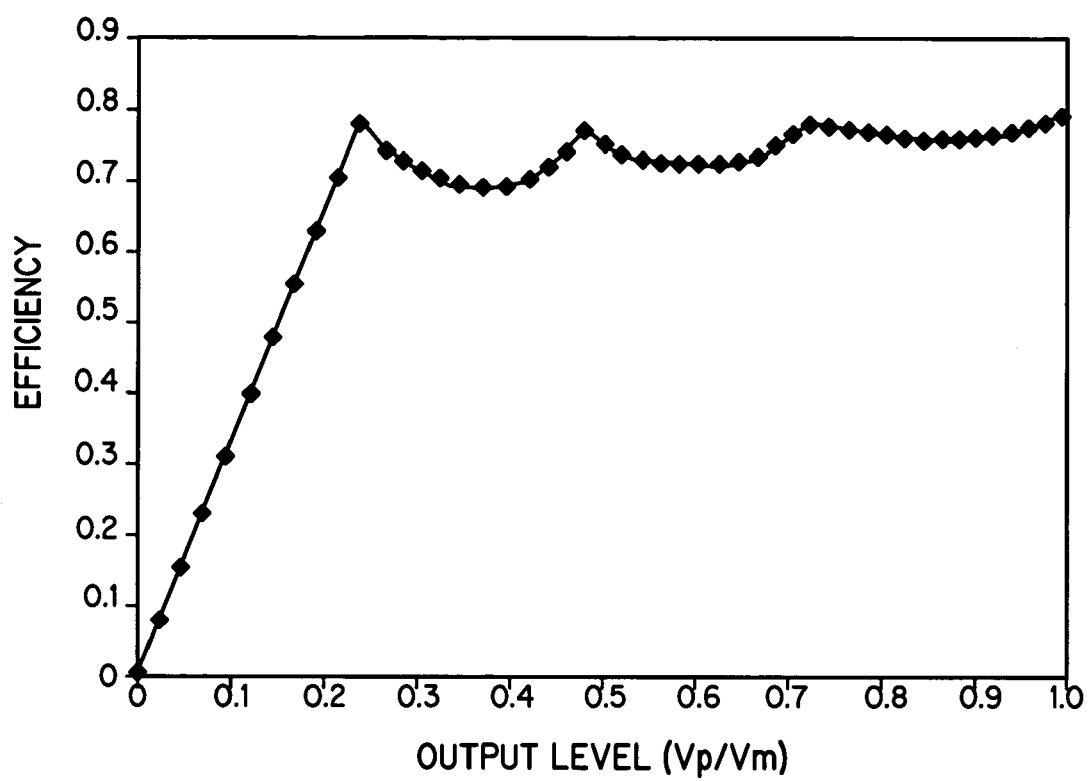
FIG. 14 is a graph of the efficiency of an embodiment of the present invention.

FIG. 14 depicts the efficiency characteristics that may be obtained with a system similar to that illustrated in FIG. 8, for example. The multiple amplifier system offers a better efficiency over a wider range of signal amplitudes than is generally obtained with a two-amplifier system (compare with FIG. 6).

The present invention is utilized to improve the efficiency performance for amplifier applications requiring high peak-to-average characteristics. The invention is viable with various linearization schemes, including digital, analog, and hybrid Pre-distortion, Feed Forward and Cross Cancellation. It is also compatible with drain biased modulation schemes.

The embodiments of the amplifiers and amplifier circuits discussed above address circuits that are configured to have generally low or high output impedances at the coupler input plane. Then a short circuit or open circuit termination for the output port of the combining coupler is selected. Specifically, the output termination of one of the output ports is directed to reflect either a short circuit or open circuit condition to the output port of a coupler depending on low or high output impedance of the amplifier circuits. For example, as illustrated in FIGS. 3A and 3B, a circuit may be selected for amplifiers having a high output impedance point in accordance with one aspect of the invention. Furthermore, the mode of operation (e.g., Mode A in FIG. 3A or Mode B in FIG. 3B) is selected. Alternatively, FIGS. 5A and 5B illustrate embodiments utilized when the output impedance of the amplifier circuits is a relatively low impedance.

However, various cases will also exist wherein the amplifiers=output impedance $Z_{out}$ is not exactly considered low or high impedance, but falls somewhere in the middle of the conditions. In the embodiments of FIGS. 3A and 3B and 5A and 5B, as well as other embodiments disclosed herein, it may be desirable to choose a particular amplifier topology after the main and auxiliary amplifier matching circuit designs are complete. That is, a matching network would be designed for each of the main and auxiliary amplifier circuits. Then, based upon the matching network, a phasing line is utilized to reflect the desired low or high output impedance, which is seen by the input of the output coupler circuit.

Depending upon the various layouts of the circuit, however, it may be necessary to utilize a circuit design wherein the desirable output impedance of the amplifier circuits is only achieved by an undesirable circuit design. For example, the matching network and phasing networks may not fit well in the overall design. As such, it may be necessary to utilize a larger circuit layout than desired. Furthermore, it is desirable to have the coupler inputs as close to the output matching network of the amplifiers as possible. However, the necessity for establishing a low output impedance or a high output impedance for the amplifiers may make such spacing considerations difficult to achieve. Embodiments of the invention, as discussed further herein below in FIGS. 15A–15B, 16A–16B and 17, disclose an alternatives of an amplifier circuit wherein design considerations and spacing can be taken into account to achieve the desired output efficiency.

Specifically, FIGS. 15A–17 disclose a general amplifier design wherein the output impedances of the peaking and auxiliary amplifiers are not limited to "low" or "high" impedance points. Various specific modes of the amplifier operation such as those shown in FIGS. 3A–3B and 5A–5B are considered specific cases of the more general modes of operation illustrated in FIGS. 15A–17.

Figure 15A:
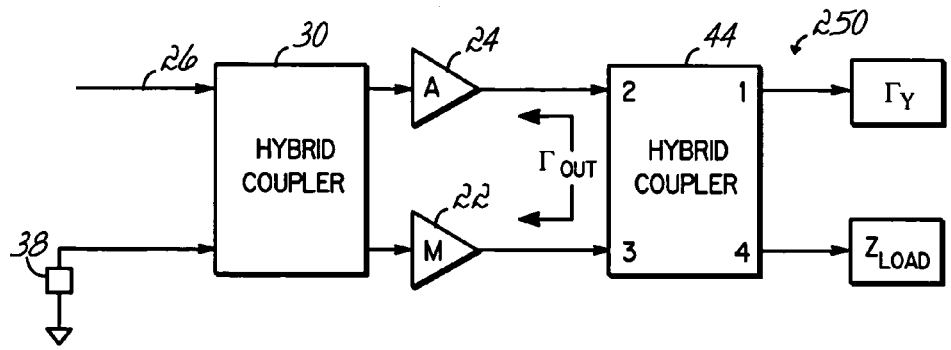
FIGS. 15A, 15B are block diagrams of additional embodiments of amplifier circuits in accordance with the principles of the present invention showing a reflection coefficient parameter.

Turning to FIG. 15A, rather than exploring the amplifier=s output impedance $Z_{out}$, a related parameter, the output reflection co-efficient $\Gamma_{out}$ is examined. $\Gamma_{out}$ is related to $Z_{out}$ by the following relationship of Equation 1:

$$\Gamma_{out}=(Z_{out}-Z_0)/(Z_{out}+Z_0)$$

where $Z_0$ is the system impedance, typically 50 Ohms (but not limited to this value).

Figure 15B:
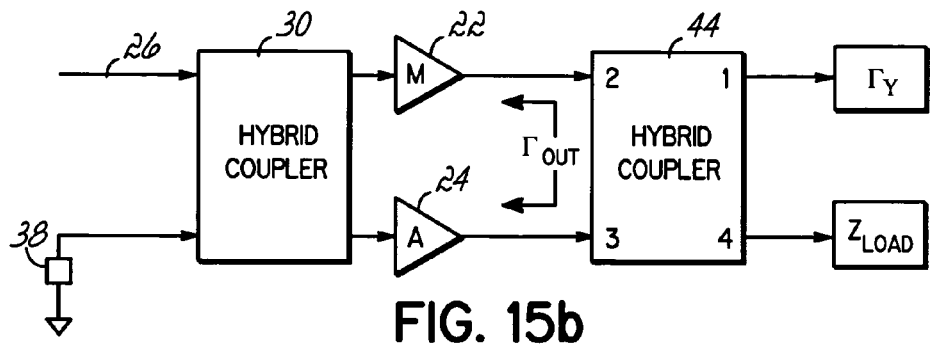

Referring to FIG. 15A, circuit 250 discloses an amplifier circuit in accordance with one aspect of the present invention wherein the impedance at the isolation port 1 of output coupler 44 is indicated with the reflection co-efficient $\Gamma_Y$. A load is coupled to the output port 4. In FIGS. 15–17, like reference numerals are utilized to indicate like components previously noted in the figures discussed above. Such reference numerals are in no way limiting with respect to the invention. Referring to FIG. 15A, the amplifier input 26 is directed to a splitter such as an input coupler circuit 30. The other input port of circuit 30 is terminated through a suitable impedance 38. The input signal 26 is divided between the main amplifier circuit 22 and the auxiliary amplifier circuit 24. The outputs of both the main and auxiliary amplifiers are then fed into hybrid coupler circuit 44 at the ports 2 and 3 and then the outputs are combined and directed to a load indicated as $Z_{LOAD}$ at the coupler output port 4. The other output terminal 1, which is designated as the isolation port, is indicated as terminated by the termination impedance indicated as the reflection coefficient $\Gamma_Y$. FIG. 15B illustrates a somewhat similar circuit, but with a different mode of operation wherein the position of the main and the auxiliary amplifiers are switched similar to the different modes illustrated in FIGS. 3A–3B and 5A–5B above.

In general, both $\Gamma$ and $Z$ are complex numbers. In accordance with illustrating one aspect of the present invention, it is convenient to represent the complex $\Gamma$ in polar form using a magnitude and angle according to Equation 2:

$$\Gamma=|\Gamma|\angle\text{ang}(\Gamma)$$

Assuming a system impedance $Z_0$ of approximately 50 Ohms, a "low" output impedance of the amplifier, for example, 10 Ohms, would yield a magnitude of 0.667 and an angle of 180° according to equations 1 and 2. Similarly, a "high" impedance of 250 Ohms, for example, would also have a magnitude of 0.667, but would yield an angle of 0°. It should be noted that the present invention is not restricted to operation at ang($\Gamma_{out}$)=0 or 180°. The range of acceptable ang($\Gamma_{out}$) values cover the entire –180° to +180° range.

Ideally, for a high efficiency amplifier, the magnitude of $\Gamma_Y$ would approach 1. The angular component or ang($\Gamma_Y$) depends upon the mode that is selected, such as the mode of FIG. 15A (Mode A) or the mode of FIG. 15B (Mode B), and the angular component of the reflection coefficient at the amplifier outputs $\Gamma_{out}$ or ang($\Gamma_{out}$). Specifically, the relationship is defined by either of Equations 3 or 4 below, depending upon the mode chosen.

(For Mode A:) ang($\Gamma_Y$)=180° –ang($\Gamma_{out}$)   EQUATION 3

(For Mode B:) ang($\Gamma_Y$)=–ang($\Gamma_{out}$)   EQUATION 4

For example, for mode A, which is illustrated in FIG. 15A, equation 3 defines the relationship. For mode B, which is illustrated in FIG. 15B, equation 4 defines the relationship. In that regard, FIGS. 3A and 5B correspond to mode A operation. On the other hand, FIGS. 3B and 5A correspond to mode B operation. In FIGS. 3A and 3B, the output impedance $Z_{out}$ is considered high. With FIG. 3A for mode A operation, ang($\Gamma_{out}$)=0 and ang($\Gamma_Y$)=180° according to Equation 3. FIG. 3B, on the other hand, corresponds to mode B operation with ang($\Gamma_{out}$)=0° and ang($\Gamma_Y$)=0°.

Similarly, FIGS. 5A and 5B disclose amplifier circuits having low output impedances. FIG. 5A, which corresponds to a mode B operation, has an ang($\Gamma_{out}$)=180° and an ang($\Gamma_Y$)=180°. FIG. 5B, on the other hand, corresponds to mode A operation, with an ang($\Gamma_{out}$)=180° and ang($\Gamma_Y$)=0°. Note that ang($\Gamma$)=180° is the same point as ang($\Gamma$)=–180°.

The present invention provides for more desirable and efficient design of an amplifier circuit, by providing a desired layout for any phasing lines, and a desired physical design for the amplifier based upon cost, space considerations, etc. In several of the embodiments disclosed above, it is desirable to try to achieve, through circuit design, an output impedance for the amplifiers, which would be considered "high" or "low". Normally, a matching network for the amplifiers is designed. Then, a phasing line network is designed to achieve the desired output impedance at the coupler plane, regardless of the space available for the components or other layout considerations for the amplifier. Finally, a short circuit or open circuit is chosen depending upon the desired mode of operation, and the positioning of the main and auxiliary amplifiers with respect to the coupler circuits.

However, in the embodiments illustrated in FIGS. 15A–17, the phasing line may be chosen for the desired layout and physical design of the amplifier circuit, without specific concern for whether the output impedance of the amplifier circuits would then ultimately qualify as either "high" or "low". Rather, once the desired layout is selected, the isolation port is terminated with an element having a reflection coefficient $\Gamma_Y$ to achieve the desired $\Gamma_{out}$ at the coupler plane based upon a particular mode of operation of the amplifier circuit. In that way, manufacturability of the amplifier is improved.

Specifically, an amplifier layout is selected utilizing a desired phasing line that accommodates the desired physical design of the amplifier. In that way, the design is not restricted to a particular length of phasing line or the spacing considerations required by the phasing line. Next, with the desired phasing line selected, a measurement is made of the reflection coefficient $\Gamma$ at any arbitrary reference point along the phasing line, such as by using a network analyzer. For example, a reflection coefficient might be measured, which, in its polar form, is reflected by 0.7(–60°). Then, a determination is made of the physical length of the phasing line from the arbitrary measurement point to the edge of the output coupler circuit 44 or coupler plane. With knowledge of that physical length, $\Gamma_{out}$ is then determined as an output reflection coefficient as illustrated in FIGS. 15A and 15B. Depending upon the amplifier layout, and the mode of operation to be utilized (e.g., mode A as illustrated in FIG. 15A; mode B as illustrated in Figure in FIG. 15B) the angular component of $\Gamma_Y$ or ang($\Gamma_Y$) is determined utilizing Equation 3 or Equation 4 above. In the example where the measured reflection coefficient is 0.7(–60°) at the measurement point, the $\Gamma_{out}$ at the coupler plane might be 0.7(–120°). Assuming mode A operation and using equation 3, then ang($\Gamma_Y$)=180°–(–120°)=300° or (–60°). For the desirable operation of the amplifier in accordance with the principals of the present invention, a suitable termination is needed for the isolation port of output coupler circuit 44 that yields an ang($\Gamma_Y$) of –60°.

Figure 16A:
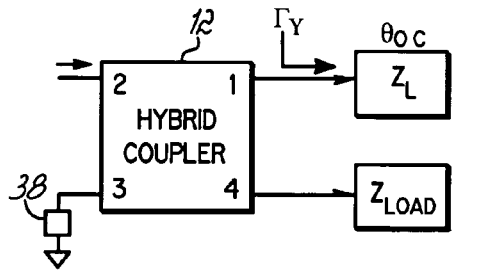
FIGS. 16A, 16B are block diagrams of embodiments of output couplers used in the present invention for achieving desired reflection coefficients.
Figure 16B:
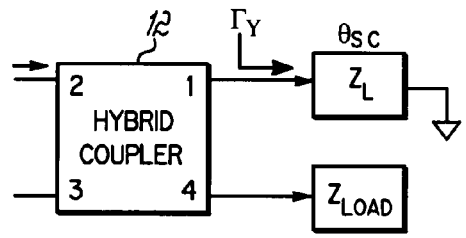
Figure 17:
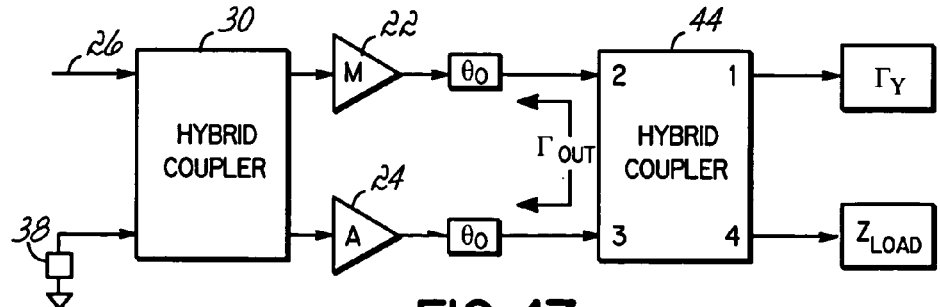
FIG. 17 is a block diagram of another embodiment of an amplifier circuit in accordance with the principles of the present invention.

For providing a suitable termination, the ang($\Gamma_Y$) might be synthesized in accordance with one embodiment of the invention, by rotating either a short circuit or an open circuit through an appropriate length of transmission line as illustrated in FIGS. 16A and 16B. FIG. 16A illustrates an embodiment wherein an open circuit transmission line is selected for termination of the coupler isolation port. FIG. 16B shows a short circuit transmission line termination of that port. The desired ang($\Gamma_Y$) is yielded by selecting a suitable electrical length of a transmission line, in degrees, for an open-circuited or short-circuited transmission line according to Equations 5 and 6 below.

$$\text{ang}(\Gamma_Y) = -2\theta_{OC} \quad \text{EQUATION 5}$$

$$\text{ang}(\Gamma_Y) = 180 - 2\theta_{SC} \quad \text{EQUATION 6}$$

Utilizing the example from above, wherein an ang($\Gamma_Y$) of $-60°$ is desired, if an open circuit termination is utilized as illustrated in FIG. 16A, Equation 5 is utilized, and ang($\Gamma_Y$)= $-60°=-2\theta_{OC}$ which yields $\theta_{OC}=30°$. Alternatively, if the embodiment of FIG. 16B is utilized with a short-circuited or ground termination, Equation 6 is utilized, and ang($\Gamma_Y$)= $60°=180°-2\theta_{SC}$, which yields $\theta_{SC}=120°$.

When selecting an appropriate length of transmission line as illustrated in FIGS. 16A and 16B, it is taken into consideration that a portion of $\theta_{OC}$ or $\theta_{SC}$ may be physically located within the package of the hybrid coupler, since the coupled lines cannot be located directly at the physical edge of the coupler package. Therefore, the design considerations should take into account such internal lengths for the purposes of the overall design.

Turning to FIG. 17, the present invention allows the length of a "phasing" transmission line or $\theta_O$, located at the amplifier outputs, to be selected in a manner that allows the output hybrid coupler circuit to be physically conveniently located with respect to the amplifier outputs. Referring to FIG. 17, ang($\Gamma_{out}$) depends on the length of the amplifier's output transmission line $\theta_{OC}$. However, any length can be accommodated by proper selection of ang($\Gamma_Y$). For the broadest bandwidth operation, it is preferable to minimize the length of the output transmission line.

While the embodiments described in FIGS. 15A–17 are illustrated with respect to a single output hybrid coupler, it is equally applicable with respect to the configuration illustrated in FIGS. 8–13 showing multiple output hybrid couplers and multiple auxiliary amplifier circuits in addition to a main amplifier circuit.

Figure 18:
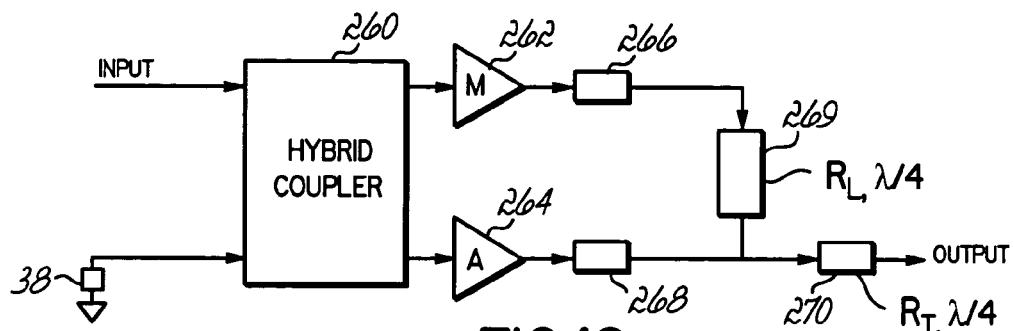
FIG. 18 is a block diagram of a Doherty amplifier.

FIGS. 18–21 illustrate another embodiment of the present invention with respect to further improving and enhancing the operation of a typical Doherty amplifier. Specifically, a diagram of a typical Doherty amplifier is shown in FIG. 18 and consists of an input splitter, such as a hybrid coupler 260, a main or carrier amplifier 262 and an auxiliary or peaking amplifier 264. The amplifiers then feed into an output combiner/impedance transforming network constructed generally with transmission lines including various transmission lines 266, 268, 269 and 270.

Figure 19:
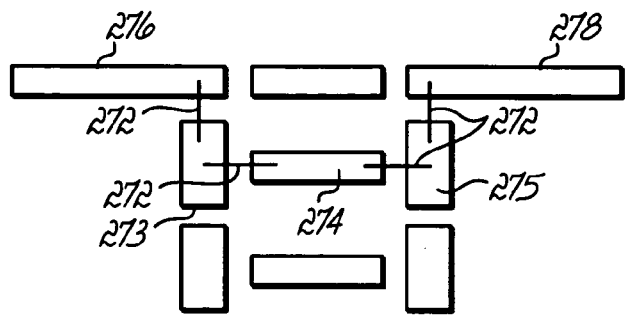
FIG. 19 is a block diagram of phasing transmission line adjustments for a Doherty amplifier.

In order to optimize operation of the circuit shown in FIG. 18, the electrical length of two phasing lines 266, 268 must be selected in accordance with the output impedance characteristics of the amplifiers 262, 264. Generally, with a typical Doherty amplifier, these line length selections are made during the amplifier design process. However, depending upon performance requirements and the tolerance of devices and components used, some adjustment of the line lengths might be required during the manufacturing process. Since both ends of the phasing lines 266, 268 are attached to other circuit elements such as the splitter or coupler circuit 260 and lines 269, 270, then the adjustment of their electrical length by changing their physical length can often be difficult. For example, facilitating a desired length change of the lines 266, 268 will often require that the transmission lines are trimmed to remove sections or soldered to add sections such as is depicted in FIG. 19, wherein multiple solder points or jumpers 272 are utilized to couple sections 273, 274 and 275 with main sections 276 and 278 to effect a different electrical length of the overall phasing lines. Alternative methods might utilize tuning capacitors. However, such capacitors often cause simultaneous undesirable transmission line impedance changes in the phasing lines.

Figure 20:
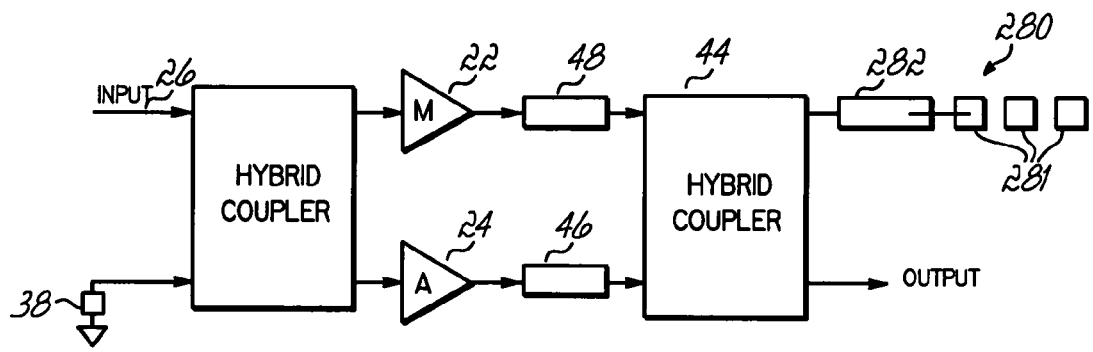
FIG. 20 is a block diagram of an additional embodiment of an amplifier circuit in accordance with principles of the invention.

In accordance with another aspect of the present invention, FIG. 20 discloses a circuit, which improves the manufacturability of a Doherty amplifier that requires a tuning adjustment during manufacturing in order to optimize its performance. Specifically, improving the ability to tune the Doherty amplifier is achieved utilizing a circuit as shown in FIG. 20, which incorporates an output combiner and impedance transforming network. The output combiner may be a hybrid coupler, such as a 90° hybrid coupler as discussed above with respect to various of the amplifier circuits disclosed herein. That is, FIG. 20 incorporates a similar basic design as the circuits illustrated in FIGS. 3A and 3B, for example. More specifically, FIG. 20 utilizes designs similar to FIG. 3B based upon the placement of the main and auxiliary amplifiers. Similar reference numerals are utilized for similar elements, as described earlier. However, the invention utilizes a tunable section of transmission line at the coupler output as illustrated by reference numeral 280 in FIG. 20. Various individual transmission line sections 281 may be selectively and electrically linked with line section 282 for achieving the desired physical and electrical length at the output port of the coupler circuit 44. The embodiment as illustrated in FIG. 20 provides a single-point adjustment/tuning operation as opposed to the two or more multipoint soldering/trimming operations that are necessary utilizing the traditional Doherty circuit of FIG. 18.

Figure 21:
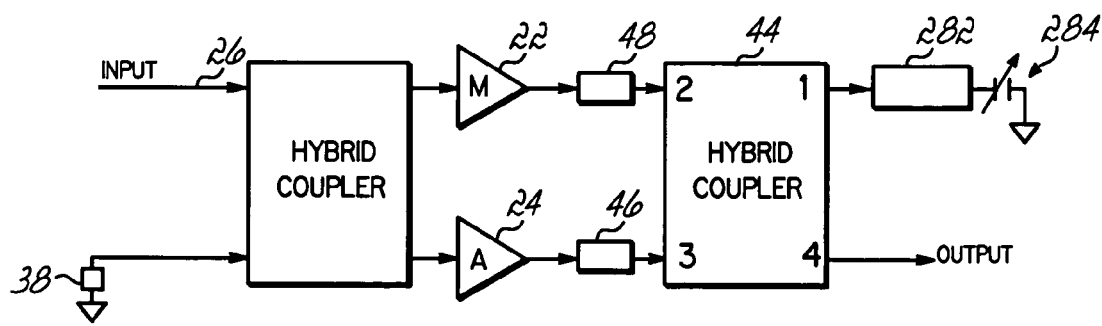
FIG. 21 is a block diagram of another additional embodiment of an amplifier circuit in accordance with principles of the invention.

In accordance with another aspect of the present invention, as illustrated in FIG. 21, the topology achieved utilizing the amplifier circuitry as illustrated in FIGS. 20–21 and the various other embodiments herein, allows for adjustment of the effective transmission line lengths utilizing a tuning capacitor 284 as illustrated in FIG. 21.

This further improves and enhances the manufacturability of the circuit by replacing a soldering/trimming transmission line operation with a more direct tuning capacitor adjustment. Furthermore, utilizing a tuning capacitor 284, the output transmission line 282 may be significantly shorter than might otherwise be required in the circuit design.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

What is claimed is:

1. An amplifier comprising:
    a main amplifier circuit;
    at least one auxiliary amplifier circuit, the auxiliary amplifier circuit being selectively operable to operate in combination with the main amplifier circuit;
    at least one hybrid coupler circuit having an output port and an isolation port and coupled to combine output signals of the amplifiers at the coupler output port;

the amplifier circuits having associated reflection coefficients ($\Gamma_{out}$) at their outputs looking into the outputs of the amplifier circuits;

a termination coupled at the isolation port of the coupler circuit, the termination being selected so the reflection coefficient of the termination ($\Gamma_Y$), looking into the termination, is based upon the reflection coefficient at the outputs of the amplifier circuits according to the following relationship:

$\text{ang}(\Gamma_Y) = 180° - \text{ang}(\Gamma_{out})$.

2. The amplifier of claim 1 further comprising a matching network proximate an amplifier circuit output, the reflection coefficient of the amplifier circuit output, looking into the output of the amplifier circuit, being a function of the matching network.

3. The amplifier of claim 1 further comprising a phasing line proximate an amplifier circuit output, the reflection coefficient of the amplifier circuit output, looking into the output of the amplifier circuit, being a function of the phasing line.

4. The amplifier of claim 1 wherein the termination is configured by terminating a length of transmission line with one of an electrical short circuit and an electrical open circuit.

5. The amplifier of claim 4 wherein the termination is selected by terminating a length of transmission line with an electrical open circuit so the reflection coefficient of the termination, looking into the termination, has an angle according to the following relationship:

$\text{ang}(\Gamma_Y) = -2\theta_{OC}$ wherein $\theta_{OC}$ is the electrical length in degrees of an open circuited transmission line.

6. The amplifier of claim 4 wherein the termination is selected by terminating a length of transmission line with an electrical short circuit so the reflection coefficient of the termination, looking into the termination, has an angle according to the following relationship:

$\text{ang}(\Gamma_Y) = 180 - 2\theta_{SC}$ wherein $\theta_{SC}$ is the electrical length in degrees of a short circuited transmission line.

7. The amplifier of claim 4 wherein the length of the transmission line for the termination includes a length of transmission line internal to the hybrid coupler circuit.

8. The amplifier of claim 1 wherein the reflection coefficient presented to the isolation port has an angle that is a function of the angle of the output reflection coefficient of the amplifier.

9. An amplifier comprising:

a plurality of amplifier circuits having associated reflection coefficients at their outputs;

at least one hybrid coupler circuit having an output port and an isolation port and coupled to combine output signals of the amplifier circuits at the coupler output port; a termination coupled at the isolation port of the coupler circuit, the termination selected so the reflection coefficient of the termination ($\Gamma_Y$), looking into the termination, is based upon the reflection coefficient ($\Gamma_{out}$) at the outputs of the amplifier circuits, looking into the outputs of the amplifier circuits according to one of the following relationships:

$\text{ang}(\Gamma_Y) = 180° - \text{ang}(\Gamma_{out})$ and $\text{ang}(\Gamma_Y) = -\text{ang}(\Gamma_{out})$.

10. The amplifier of claim 9 further comprising a matching network proximate an amplifier circuit output, the reflection coefficient of the amplifier output, looking into the output of the amplifier circuit, being a function of the matching network.

11. The amplifier of claim 9 further comprising a phasing line proximate an amplifier circuit output, the reflection coefficient of the amplifier output, looking into the output of the amplifier circuit, being a function of the phasing line.

12. The amplifier of claim 1 wherein the termination is configured by terminating a length of transmission line with one of an electrical short circuit and an electrical open circuit.

13. The amplifier of claim 12 wherein the termination is configured by terminating a length of transmission line with an electrical open circuit so the reflection coefficient of the termination, looking into the termination, has an angle according to the following relationship:

$\text{ang}(\Gamma_Y) = -2\theta_{OC}$ wherein $\theta_{OC}$ is the electrical length in degrees of an open circuited transmission line.

14. The amplifier of claim 12 wherein the termination is configured by terminating a length of transmission line with an electrical short circuit so the reflection coefficient of the termination, looking into the termination, has an angle according to the following relationship:

$\text{ang}(\Gamma_Y) = 180 - 2\theta_{SC}$ wherein $\theta_{SC}$ is the electrical length in degrees of a short circuited transmission line.

15. The amplifier of claim 12 wherein the length of the transmission line for the termination includes a length of transmission line internal to the hybrid coupler circuit.

16. The amplifier of claim 9 wherein the reflection coefficient presented to the isolation port has an angle that is a function of the angle of the output reflection coefficient of the amplifier.

17. A method of configuring an amplifier comprising:

combining output signals of a main amplifier circuit and at least one auxiliary amplifier circuit with at least one hybrid coupler circuit having an output port and an isolation port, and providing an output at an output port of the coupler circuit;

the main and auxiliary amplifier circuits having associated reflection coefficients ($\Gamma_{out}$) at their outputs, looking into the outputs of the amplifier circuits;

coupling a termination at the isolation port of the coupler circuit; selecting the termination to have a reflection coefficient ($\Gamma_Y$), looking into the termination, that is based upon the reflection coefficient at the outputs of the amplifier circuits according to the following relationship:

$\text{ang}(\Gamma_Y) = 180° - \text{ang}(\Gamma_{out})$.

18. The method amplifier of claim 17 further comprising coupling a matching network proximate to an amplifier output, the reflection coefficient of the amplifier output, looking into the output of the amplifier circuit, being a function of the matching network.

19. The method of claim 17 further comprising coupling a phasing line proximate to an amplifier output, the reflection coefficient of the amplifier output, looking into the output of the amplifier circuit, being a function of the phasing line.

20. The method of claim 17 wherein configuring the termination includes terminating a length of transmission line with one of an electrical short circuit and an electrical open circuit.

21. The method of claim 20 comprising configuring the termination by terminating a length of transmission line with an electrical open circuit so the reflection coefficient of the termination, looking into the termination, has an angle according to the following relationship:

$$\text{ang}(\Gamma_Y) = -2\theta_{OC}$$

wherein $\theta_{OC}$ is the electrical length in degrees of an open circuited transmission line.

22. The method of claim 20 comprising configuring the termination by terminating a length of transmission line with an electrical short circuit so the reflection coefficient of the termination, looking into the termination, has an angle according to the following relationship:

$$\text{ang}(\Gamma_Y) = 180 - 2\theta_{SC}$$

wherein $\theta_{SC}$ is the electrical length in degrees of a short circuited transmission line.

23. The method of claim 20 wherein the length of the transmission line for the termination includes a length of transmission line internal to the hybrid coupler circuit.

24. The method of claim 17 wherein the reflection coefficient presented to the isolation port has an angle that is a function of the angle of the output reflection coefficient of the amplifier.

25. An amplifier comprising:
a main amplifier circuit;
at least one auxiliary amplifier circuit, the auxiliary amplifier circuit being selectively operable to operate in combination with the main amplifier circuit;
at least one hybrid coupler circuit having an output port and an isolation port and coupled to combine output signals of the amplifiers at the coupler output port;
the amplifier circuits having associated reflection coefficients ($\Gamma_{out}$) at their outputs looking into the outputs of the amplifier circuits;
a termination coupled at the isolation port of the coupler circuit, the termination being selected so the reflection coefficient of the termination ($\Gamma_Y$), looking into the termination, is based upon the reflection coefficient at the outputs of the amplifier circuits according to the following relationship:

$$\text{ang}(\Gamma_Y) = -\text{ang}(\Gamma_{out}).$$

26. The amplifier of claim 25 further comprising at least one of a matching network or a phasing line proximate an amplifier circuit output, the reflection coefficient of the amplifier circuit output, looking into the output of the amplifier circuit, being a function of at least one of the matching network or phasing line.

27. The amplifier of claim 25 wherein the termination is configured by terminating a length of transmission line with one of an electrical short circuit and an electrical open circuit.

28. The amplifier of claim 27 wherein the termination is selected by terminating a length of transmission line with an electrical open circuit so the reflection coefficient of the termination, looking into the termination, has an angle according to the following relationship:

$$\text{ang}(\Gamma_Y) = -2\theta_{OC}$$

wherein $\theta_{OC}$ is the electrical length in degrees of an open circuited transmission line.

29. The amplifier of claim 4 wherein the termination is selected by terminating a length of transmission line with an electrical short circuit so the reflection coefficient of the termination, looking into the termination, has an angle according to the following relationship:

$$\text{ang}(\Gamma_Y) = 180 - 2\theta_{SC}$$

wherein $\theta_{SC}$ is the electrical length in degrees of a short circuited transmission line.

30. The amplifier of claim 4 wherein the length of the transmission line for the termination includes a length of transmission line internal to the hybrid coupler circuit.

31. A method of configuring an amplifier comprising:
combining output signals of a main amplifier circuit and at least one auxiliary amplifier circuit with at least one hybrid coupler circuit having an output port and an isolation port, and providing an output at an output port of the coupler circuit;
the main and auxiliary amplifier circuits having associated reflection coefficients ($\Gamma_{out}$) at their outputs, looking into the outputs of the amplifier circuits;
coupling a termination at the isolation port of the coupler circuit; selecting the termination to have a reflection coefficient ($\Gamma_Y$), looking into the termination, that is based upon the reflection coefficient at the outputs of the amplifier circuits according to the following relationship:

$$\text{ang}(\Gamma_Y) = -\text{ang}(\Gamma_Y).$$

32. The method amplifier of claim 31 further comprising coupling a matching network proximate to an amplifier output, the reflection coefficient of the amplifier output, looking into the output of the amplifier circuit, being a function of the matching network.

33. The method of claim 31 further comprising coupling a phasing line proximate to an amplifier output, the reflection coefficient of the amplifier output, looking into the output of the amplifier circuit, being a function of the phasing line.

34. The method of claim 31 wherein configuring the termination includes terminating a length of transmission line with one of an electrical short circuit and an electrical open circuit.

35. The method of claim 34 comprising configuring the termination by terminating a length of transmission line with an electrical open circuit so the reflection coefficient of the termination, looking into the termination, has an angle according to the following relationship:

$$\text{ang}(\Gamma_Y) = -2\theta_{OC}$$

wherein $\theta_{OC}$ is the electrical length in degrees of an open circuited transmission line.

36. The method of claim 34 comprising configuring the termination by terminating a length of transmission line with an electrical short circuit so the reflection coefficient of the termination, looking into the termination, has an angle according to the following relationship:

$$\text{ang}(\Gamma_Y) = 180 - 2\theta_{SC}$$

wherein $\theta_{SC}$ is the electrical length in degrees of a short circuited transmission line.

37. The method of claim 34 wherein the length of the transmission line for the termination includes a length of transmission line internal to the hybrid coupler circuit.

38. The method of claim 31 wherein the reflection coefficient presented to the isolation port has an angle that is a function of the angle of the output reflection coefficient of the amplifier.

* * * * *